(12) United States Patent
Sheng et al.

(10) Patent No.: US 9,071,280 B1
(45) Date of Patent: *Jun. 30, 2015

(54) METHOD AND APPARATUS FOR CONTROLLING A NUMBER OF DECODING ITERATIONS OF A DECODER BASED ON A TEMPERATURE OF AN INTEGRATED CIRCUIT THAT INCLUDES THE DECODER

(71) Applicant: Marvell International LTD., Hamilton (BM)

(72) Inventors: Hongying Sheng, San Jose, CA (US); Zining Wu, Los Altos, CA (US)

(73) Assignee: Marvell International LTD., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 14/518,461

(22) Filed: Oct. 20, 2014

Related U.S. Application Data

(63) Continuation of application No. 13/415,501, filed on Mar. 8, 2012, now Pat. No. 8,869,010.

(60) Provisional application No. 61/450,992, filed on Mar. 9, 2011, provisional application No. 61/530,816, filed on Sep. 2, 2011.

(51) Int. Cl.
*H03M 13/00* (2006.01)
*H03M 13/03* (2006.01)
*H03M 13/29* (2006.01)

(52) U.S. Cl.
CPC ...... *H03M 13/2909* (2013.01); *H03M 13/2948* (2013.01); *H03M 13/2957* (2013.01)

(58) Field of Classification Search
CPC .......... H03M 13/255; H03M 13/2957; H03M 13/1105; H03M 13/45; H03M 13/258; H03M 13/256; H03M 13/1128; H03M 13/3746; H03M 13/2948; H04L 1/005
USPC ......... 714/752, 755, 758, 774, 786, 787, 790, 714/792, 799, 785, 793
See application file for complete search history.

(56) References Cited

U.S. PATENT DOCUMENTS

| | | |
|---|---|---|
| 8,255,763 B1 | 8/2012 | Yang et al. |
| 8,341,486 B2 | 12/2012 | Rault et al. |
| 8,438,461 B2 | 5/2013 | Varnica et al. |
| 8,533,496 B1 | 9/2013 | Varnica et al. |
| 8,751,889 B2 * | 6/2014 | Zhang et al. .................. 714/746 |
| 2013/0111289 A1* | 5/2013 | Zhang et al. .................. 714/752 |
| 2013/0343495 A1* | 12/2013 | Han et al. ...................... 375/341 |

* cited by examiner

*Primary Examiner* — Christine Tu

(57) ABSTRACT

An integrated circuit including a first decoder, a second decoder, a sensor, and a controller. The first decoder generates first data by performing a first number of decoding iterations and generates second data after performing all of the first number of decoding iterations. The second decoder performs a second number of decoding iterations and generates soft information based on input samples and/or the second data. Each of the second number of decoding iterations is performed after all of the first number of decoding iterations. The first decoder generates the first data based on the soft information and/or the first data from one of the first number of decoding iterations. The sensor senses a temperature of the integrated circuit. The controller controls, based on the temperature of the integrated circuit, at least one of the first number of decoding iterations or the second number of decoding iterations.

15 Claims, 7 Drawing Sheets

METHOD AND APPARATUS FOR CONTROLLING A NUMBER OF DECODING ITERATIONS OF A DECODER BASED ON A TEMPERATURE OF AN INTEGRATED CIRCUIT THAT INCLUDES THE DECODER

CROSS-REFERENCE TO RELATED APPLICATIONS

The present disclosure is a continuation of U.S. patent application Ser. No. 13/415,501 (now U.S. Pat. No. 8,869, 010) filed on Mar. 8, 2012 which claims the benefit of U.S. Provisional Patent Application Ser. No. 61/450,992 filed on Mar. 9, 2011, entitled "REDUCE ITERATIVE DECODER ACTIVITIES BASED ON SENSOR," and U.S. Provisional Patent Application Ser. No. 61/530,816 filed on Sep. 2, 2011, entitled "REDUCE ITERATIVE DECODER ACTIVITIES BASED ON SENSOR." The entire disclosures of the applications referenced above are incorporated herein by reference.

FIELD

The present disclosure relates generally to the field of recovering data from a noisy storage channel, transmission channel, and the like. More particularly, the present disclosure relates to iterative decoders for such data recovery.

BACKGROUND

Data is often corrupted during transmission and storage. For example, noise in the transmission and storage channels can change the values of some of the bits in the data. Forward error correction codes have been developed to mitigate such corruption. According to such forward error correction codes, the data is encoded prior to storage or transmission of the data, and decoded after transmission or retrieval of the data. Forward error correction codes have been developed that significantly improve the reliability of the transmission or storage channel.

One such class of forward error correction codes are the iterative codes, where the decoder can decode the data multiple times, achieving better results with each iteration. In general, the number of decoding iterations is varied according to the noise in the channel. That is, as the channel noise increases, the number of decoding iterations is also increased, in order to successfully recover data from the channel. In many storage and transmission channels, the channel noise varies with time. Therefore, iterative decoders are designed to vary the number of decoding iterations accordingly.

The number of decoding iterations is an important consideration in the design of an iterative decoder. As the number of decoding iterations increases, so does the power consumption of the decoder. The decoder must be designed to accommodate the maximum number of decoding iterations. Therefore the decoder must be designed to accommodate the worst-case power and current consumption.

Under worst-case conditions, for example when a hard disk drive head is severely off track, the decoder will run the maximum number of iterations at all times. Peak current is consumed when the maximum number of iterations are running over a long period, and is proportional to maximum number of decoding iterations. High peak current makes the design of power supply and die package very difficult and expensive. Therefore it is desirable to design a system with lower peak power.

SUMMARY

In general, in one aspect, an embodiment features an apparatus comprising: an iterative decoder configured to generate codewords based on input samples, wherein the iterative decoder is further configured to perform a number of decoding iterations for each codeword, wherein the number of decoding iterations is an integer greater than zero, and wherein the number of decoding iterations does not exceed a limit umber; and a sensor configured to generate one or more measurements of a physical variable, wherein the limit number is set in accordance with the one or more measurements generated by the sensor. Some embodiments comprise a controller configured to set the limit number in accordance with the one or more measurements generated by the sensor.

In general, in one aspect, an embodiment features a method comprising: generating codewords based on input samples, wherein generating the codewords comprises performing a number of decoding iterations for each codeword, wherein the number is an integer greater than zero, and wherein the number of decoding iterations does not exceed a limit number; generating one or more measurements of an physical variable, wherein the limit number is set in accordance with the one or more measurements. Some embodiments comprise setting the limit number in accordance with the one or more measurements.

In general, in one aspect, an embodiment features a storage device comprising: storage media; a read circuit configured to obtain input samples of data stored in the storage media; an iterative decoder configured to generate codewords based on the input samples, wherein the iterative decoder is further configured to perform a number of decoding iterations for each codeword, wherein the number of decoding iterations is an integer greater than zero, and wherein the number of decoding iterations does not exceed a limit number; and a sensor configured to generate one or more measurements of an physical variable, wherein the limit number is set in accordance with the one or more measurements generated by the sensor. Some embodiments comprise a controller configured to set the limit number in accordance with the one or more measurements generated by the sensor.

The details of one or more implementations are set forth in the accompanying drawings and the description below. Other features will be apparent from the description and drawings, and from the claims.

Figure 1:
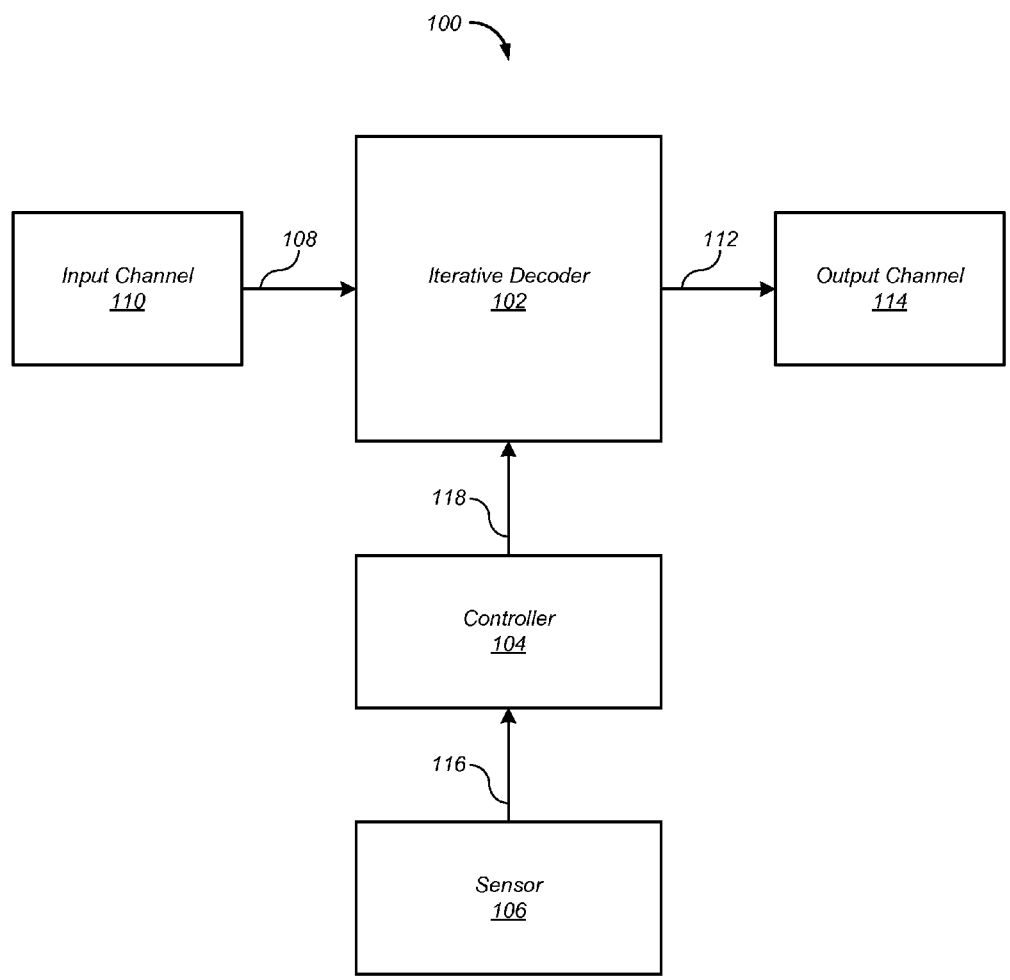
FIG. 1 shows elements of a decoding system according to one embodiment.

The leading digit(s) of each reference numeral used in this specification indicates the number of the drawing in which the reference numeral first appears.

DESCRIPTION

Embodiments of the present disclosure control the number of decoding iterations performed by an iterative decoder based on measurements of physical variables obtained by sensors. For example, according to one embodiment, the maximum allowed number of decoding iterations is reduced when the temperature of the decoder exceeds a predetermined threshold temperature. This and other embodiments are described in detail below.

FIG. 1 shows elements of a decoding system 100 according to one embodiment. Although in the described embodiments the elements of decoding system 100 are presented in one arrangement, other embodiments may feature other arrangements. For example, elements of decoding system 100 can be implemented in hardware, software, or combinations thereof.

Referring to FIG. 1, decoding system 100 includes an iterative decoder 102, a controller 104, and a sensor 106. Iterative decoder 102 receives samples 108 of data from an input channel 110 and generates codewords 112 based on samples 108. Iterative decoder 102 provides codewords 112 to an output channel 114.

Sensor 106 provides measurements 116 of one or more physical variables. The physical variables include temperature, voltage, current, power consumption and the like, but do not include operational variables such as bit error rate, number of iterations, and the like. For example, the physical variables can include the current consumption of iterative decoder 102, the temperature of iterative decoder 102, the temperature of the power supply for iterative decoder 102, the voltage at iterative decoder 102, the power consumption of iterative decoder 102, and the like.

Controller 104 controls the maximum number of iterations of iterative decoder 102 according to the measurements 116 of the physical variable(s), for example as that establishes the maximum number of iterations that iterative decoder 102 can perform for each codeword 112. In other embodiments, the maximum number of iterations is stored in a register, and iterative decoder 102 reads the number from the register. However, other techniques can be used instead.

Iterative decoder 102 can be implemented as one or more iterative decoders. The iterative decoders can include any sort of iterative decoder. Examples of iterative decoders include low-density parity-check code (LDPC) decoders, turbo code decoders, accumulate-repeat code decoders, soft-output Viterbi algorithm (SOVA) decoders, Bahl-Cocke-Jelinek-Raviv (BCJR) decoders, max a posteriori (MAP) decoders, and the like. Iterative decoder 102 generates codewords 112 based on samples 108 by performing a number of decoding iterations, where the number of decoding iterations is an integer greater than zero. The decoding iterations cease when iterative decoder 102 successfully decodes a codeword 112 or when a prescribed maximum number of iterations is reached. But according to the disclosed embodiments, the number of decoding iterations for each codeword can be limited by controller 104 in accordance with physical measurements 116.

Decoding system 100 can be implemented in many types of data systems, for example including data transmission systems, data storage systems, and the like. The data storage systems can include, for example, hard disk drives, solid state drives, and the like. The data transmission systems can include wireless data transmission devices, wired data transmission devices, optical data transmission devices, and the like. In an example of a data storage system, input channel 110 provides samples 108 of the data stored in the storage media, and output channel 114 provides codewords 112 to a processor or the like. In an example data transmission system, input channel 110 provides samples 108 of the data received over the transmission channel, and output channel 114 provides codewords 112 to a processor or the like.

Figure 2:
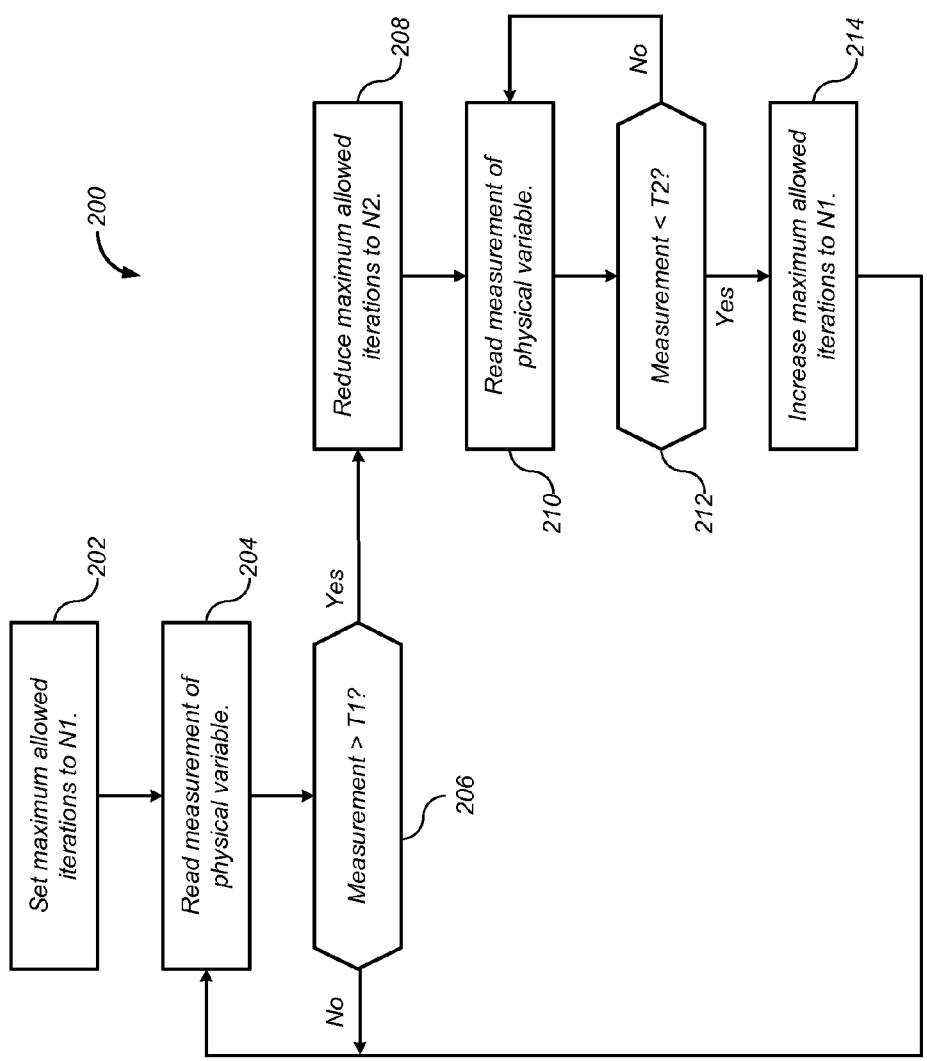
FIG. 2 shows a process for the decoding system of FIG. 1 according to one embodiment.

FIG. 2 shows a process 200 for decoding system 100 of FIG. 1 according to one embodiment. Although in the described embodiments the elements of process 200 are presented in one arrangement, other embodiments may feature other arrangements. For example, in various embodiments, some or all of the elements of process 200 can be executed in a different order, concurrently, and the like. Also some elements of process 200 may not be performed, and may not be executed after each other. Process 200 employs only one physical variable. However, other embodiments employ multiple physical variables. When multiple physical variables are employed, they can be compared to respective thresholds, combined in a weighted manner before and/or after comparison, and the like. In other embodiments, the limit number can be a function of the physical measurement 116.

Process 200 of FIG. 2 employs two predetermined thresholds T1 and T2 and two predetermined decoding iteration limits N1 and N2 where T1>T2 and N1>N2. However, other embodiments employ other numbers of thresholds and decoding iteration limit numbers. These limit numbers and thresholds are chosen to keep iterative decoder 102 within predetermined design limits, for example, so as to prevent the temperature of a die in which iterative decoder 102 is implemented from exceeding the thermal design limit of the die.

According to process 200 of FIG. 2, the maximum number of decoding iterations is initially limited to limit number N1. When the measurement 116 of the physical variable exceeds threshold T1, the maximum number of decoding iterations is reduced to limit number N2. When the measurement 116 of the physical variable subsequently falls below threshold T2, the maximum number of decoding iterations is increased to limit number N1.

Referring to FIG. 2, at 202 controller 104 initially sets the maximum allowed number of decoding iterations to limit number N1. At 204 controller 104 reads a measurement 116 of a physical variable provided by sensor 106. At 206 controller 104 compares the measurement 116 with threshold T1. In one embodiment, sensor 106 provides measurements 116 of the temperature of a die in which iterative decoder 102 is implemented, and threshold T1 represents a maximum allowable temperature for the die. While the measurements 116 are not greater than threshold T1, iterative decoder 102 continues to operate according to limit number N1. That is, the number of decoding iterations performed by iterative decoder 102 for a single codeword does not exceed limit number N1. Controller 104 continues to read measurements 116 of the physical variable provided by sensor 106 at 204, and to compare the measurements 116 with threshold T1 at 206.

When a measurement 116 exceeds threshold T1 at 206, then at 208 controller 104 reduces the maximum number of decoding iterations from limit number N1 to limit number N2. At 210 controller 104 then reads a measurement 116 of an physical variable provided by sensor 106, and at 212 compares the measurement 116 with threshold T2. While the measurement 116 is not less than threshold T2, iterative decoder 102 operates according to limit number N2. That is, the maximum number of decoding iterations performed by iterative decoder 102 for a single codeword is limited to limit number N2. At 210 controller 104 continues to read measurement 116 of the physical variable provided by sensor 106, and at 212 to compare the measurement 116 with threshold T2. When a measurement 116 falls below threshold T2 at 212, at 214 controller 104 increases the maximum number of decoding iterations from limit number N2 to limit number N1. Iterative decoder 102 then resumes operating according to limit number N1.

Figure 3:
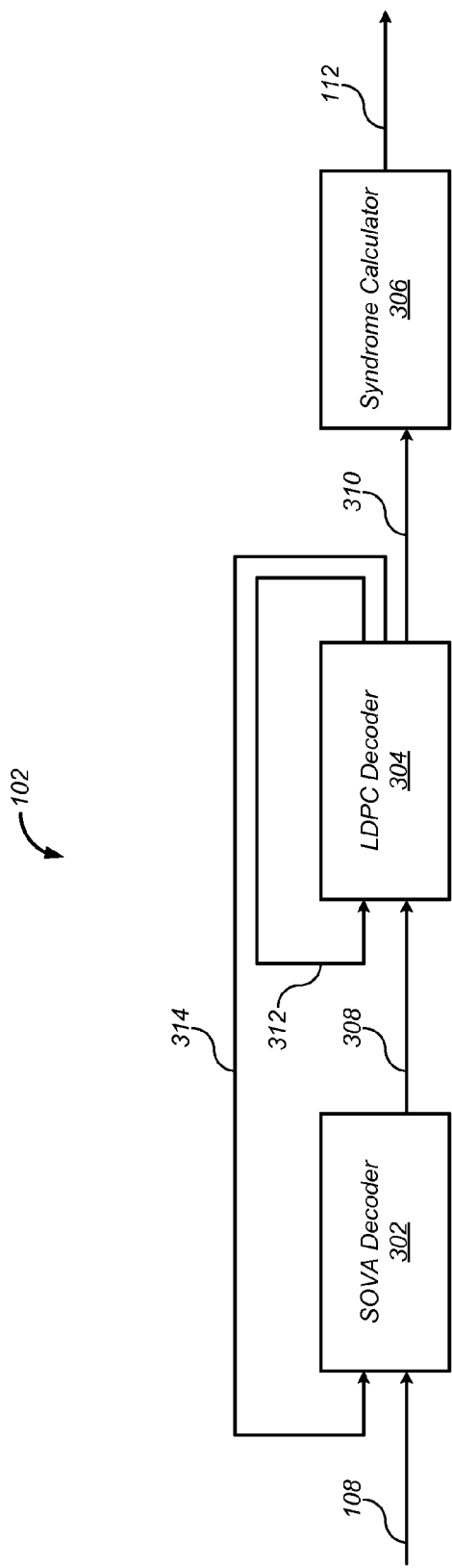
FIG. 3 shows an embodiment where an iterative decoder includes multiple iterative decoders that iterate together in a nested manner.

In some embodiments, iterative decoder 102 includes multiple iterative decoders that iterate together in a nested manner. One such embodiment is shown in FIG. 3. Referring to FIG. 3, iterative decoder 102 includes a soft-output Viterbi algorithm (SOVA) decoder 302, a low-density parity-check code (LDPC) decoder 304, and a syndrome calculator 306. In other embodiments, SOVA decoder 302 can be replaced with a Bahl-Cocke-Jelinek-Raviv (BCJR) decoder, a max a posteriori (MAP) decoder, or the like, and LDPC decoder 304 can be replaced with a turbo code decoder, accumulate-repeat code decoder, or the like. In some embodiments, LDPC decoder 304 can be replaced with multiple LDPC decoders 304. In the current example, SOVA decoder 302 is termed the "outer" iterative decoder, and LDPC decoder 304 is termed the "inner" iterative decoder. LDPC decoder 304 performs at least one "inner" decoding iteration for each "outer" decoding iteration performed by SOVA decoder 302.

SOVA decoder 302 receives samples 108 of data from input channel 110, and in a first outer decoding iteration generates soft information 308 based on samples 108. Soft information 308 provides an indication of the accuracy of samples 108. LDPC decoder 304 performs one or more inner iterations. In each inner decoding iteration, LDPC decoder 304 produces hard decisions 310. Syndrome calculator 306 calculates a syndrome of hard decisions 310. The calculation of the syndrome can be performed according to conventional methods. When the syndrome is all zeros, iterative decoder outputs a codeword 112.

When the syndrome is not all zeros, iterative decoder 102 continues to iterate, subject to the limit numbers provided by controller 104. In particular, iterative decoder 102 performs one or more inner decoding iterations. In each of the inner decoding iterations, LDPC decoder 304 generates inner extrinsic information 312 based on soft information 308 and/or inner extrinsic information 312 from a previous inner decoding iteration. After a predetermined number of inner decoding iterations, LDPC decoder 304 generates outer extrinsic information 314. In each outer decoding iteration, SOVA decoder 302 generates soft information 308 based on samples 108 and/or outer extrinsic information 314 from a previous outer iteration.

In nested embodiments such as that of FIG. 3, controller 104 can control the number of inner decoding iterations and/or the number of outer decoding iterations, for example according to process 200 of FIG. 2. In various embodiments, the number of inner decoding iterations can be a function of the number of outer decoding iterations, or can be independent of the number of outer decoding iterations.

Figure 4:
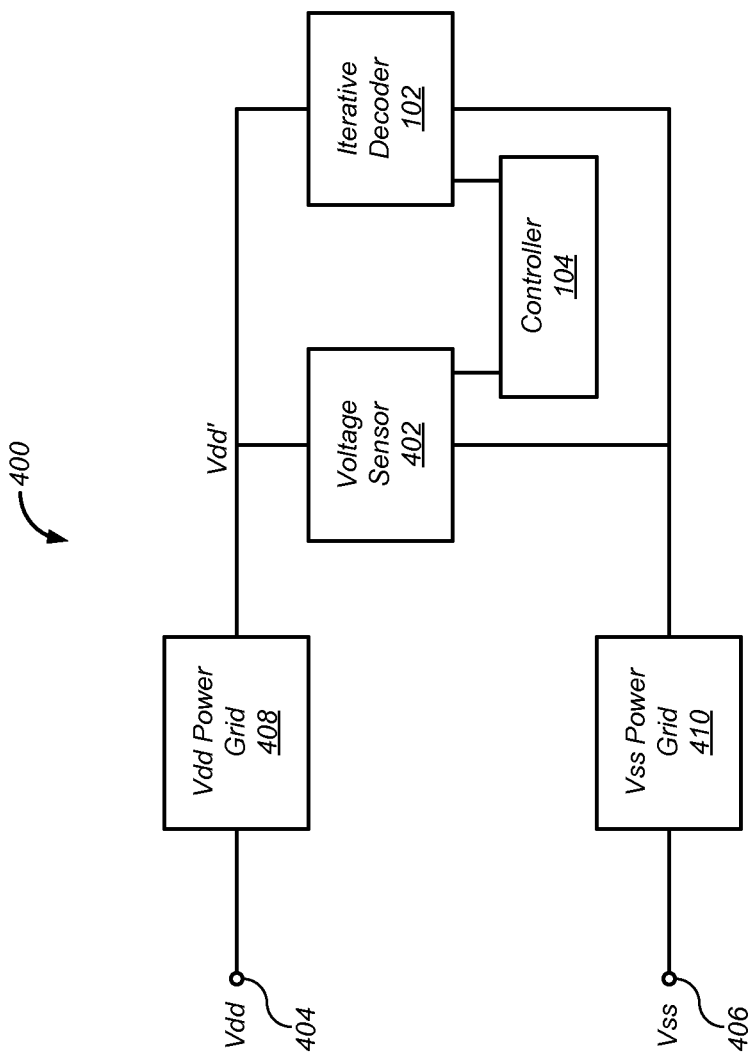
FIG. 4 shows a block diagram of an integrated circuit comprising an iterative decoder where a sensor is implemented as a voltage sensor.

As mentioned above, sensor 106 provides measurements 116 of one or more physical variables. FIG. 4 shows a block diagram of an integrated circuit 400 comprising iterative decoder 102 where sensor 106 is implemented as a voltage sensor 402. Referring to FIG. 4, integrated circuit 400 receives supply voltages Vdd and Vss on pins 404 and 406, respectively, and provides those voltages to iterative decoder 102 via power grids 408 and 410, respectively. Due to the resistance of power grids 408, 410, the voltage Vdd' seen by iterative decoder 102 is lower than voltage Vdd. Voltage sensor 402 measures the voltage drop, which is proportional to the current consumption of the chip. Controller 104 limits the maximum number of decoding iterations performed by iterative decoder 102 in accordance with the voltage drop.

Figure 5:
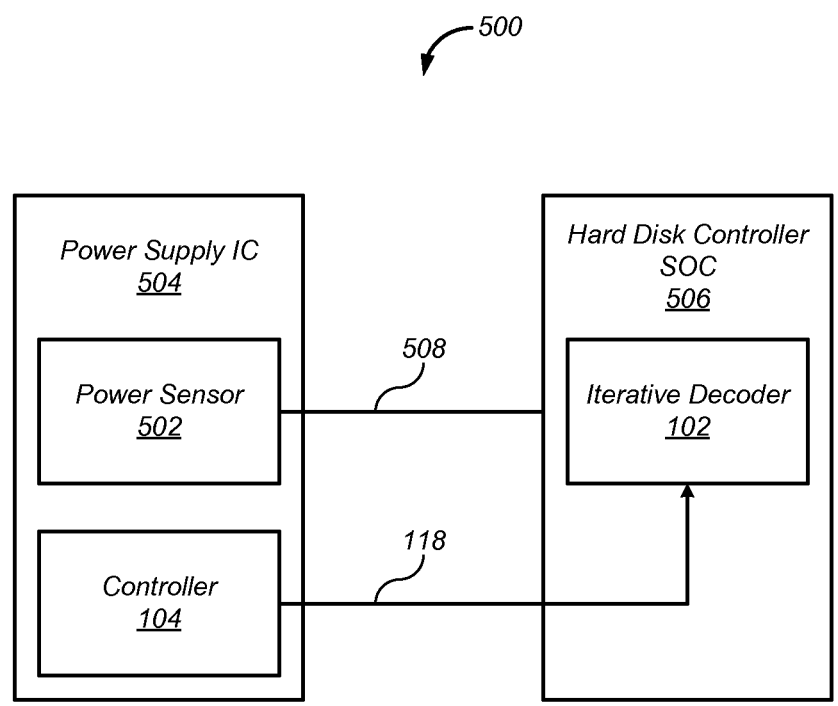
FIG. 5 shows elements of a hard disk drive comprising an iterative decoder where an sensor is implemented as a power sensor.

FIG. 5 shows elements of a hard disk drive 500 comprising iterative decoder 102 where sensor 106 is implemented as a power sensor 502. Referring to FIG. 5, hard disk drive 500 includes a hard disk controller system-on-chip (SOC) 506 and a power supply integrated circuit (IC) 504. Hard disk controller SOC 506 include iterative decoder 102. In FIG. 5, power supply IC 504 includes power sensor 502 and controller 104. However, power sensor 502 and controller 104 can be part of iterative decoder 102 or part of hard disk controller SOC 506 instead. Power sensor 502 can measure the instant power, or average power over a short period, e.g., 1 ms, provided to SOC 506 by power supply line 508. Controller 104 limits the maximum number of decoding iterations performed by iterative decoder 102 in accordance with the power measurements 116 provided by power sensor 502.

Figure 6:
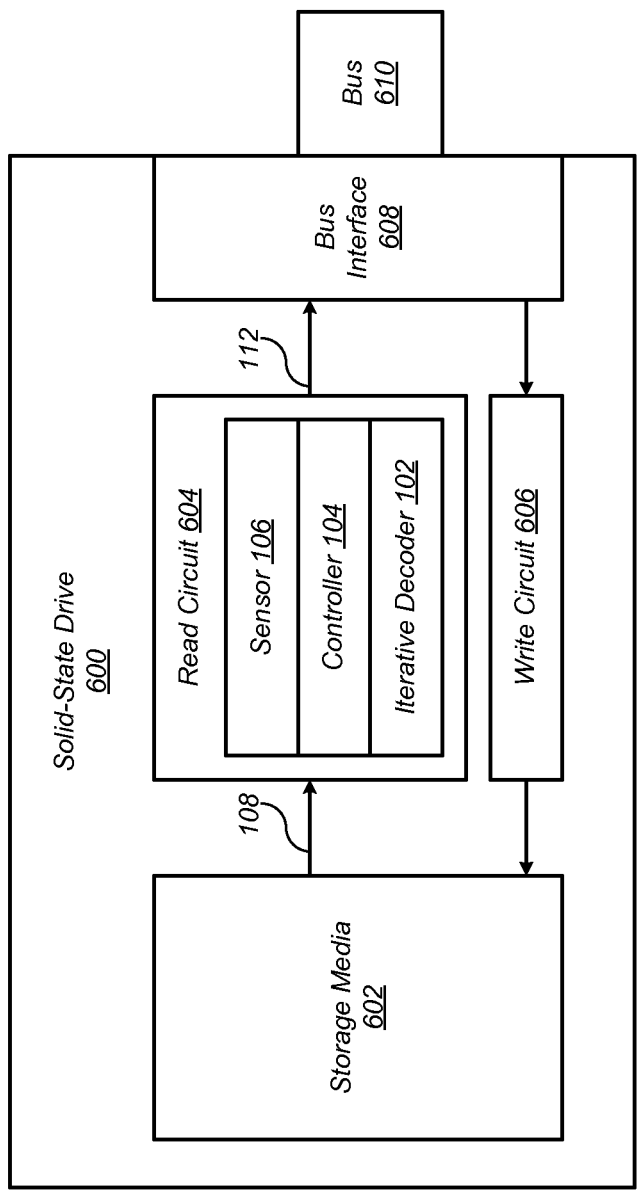
FIG. 6 shows a solid state drive comprising an iterative decoder according to one embodiment.

As mentioned above, iterative decoder 102 can be implemented in a data storage device, data transmission device, and the like. FIG. 6 shows a solid state drive 600 comprising iterative decoder 102 according to one embodiment. Referring to FIG. 6, solid state drive 600 includes storage media 602, a read circuit 604 for reading data from storage media 602, a write circuit 606 for writing data to storage media 602, and a bus interface 608 for exchanging data with a data bus 610. Read circuit 604 can be implemented as one or more integrated circuits, and includes iterative decoder 102, controller 104, and sensor 106. Iterative decoder 102 decodes samples 108 read from storage media 602, and provides corresponding codewords 112 to bus interface 608. Controller 104 limits the maximum number of decoding iterations performed by iterative decoder 102 in accordance with measurements 116 provided by sensor 106.

Figure 7:
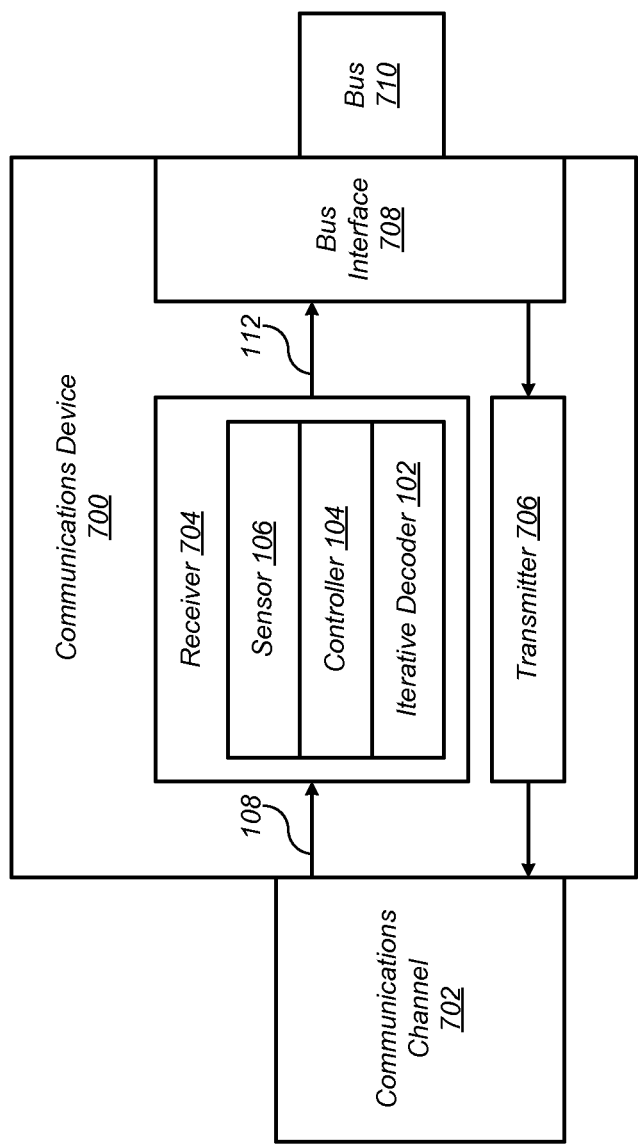
FIG. 7 shows a communications device comprising an iterative decoder according to one embodiment.

FIG. 7 shows a communications device 700 comprising iterative decoder 102 according to one embodiment. Referring to FIG. 7, communications device 700 includes a receiver 704 for reading data from a communications channel 702, a transmitter 706 for sending data to communications channel 702, and a bus interface 708 for exchanging data with a data bus 710. Receiver 704 can be implemented as one or more integrated circuits, and includes iterative decoder 102, controller 104, and sensor 106. Iterative decoder 102 decodes samples 108 read from communications channel 702, and provides corresponding codewords 112 to bus interface 708. Controller 104 limits the maximum number of decoding iterations performed by iterative decoder 102 in accordance with measurements 116 provided by sensor 106.

Various embodiments of the present disclosure may have one or more of the following advantages. Some embodiments boost component reliability by having direct control over the die temperature. For example, if the die can sustain 125° C., and the temperature threshold is set to 120° C., the chip package won't be damaged. Some embodiments save cost by providing better design margin for the power supply and decoder package. Traditionally, the decoder package and power supply have been designed to handle the current when the maximum number of iterations are running, even if in average the number of iterations required is much lower. In some embodiments, the package and power supply can be designed for fewer iterations, and consequently for less current and power. This reduced design margin allows for a smaller and less-expensive component.

Various embodiments of the present disclosure can be implemented in digital electronic circuitry, or in computer hardware, firmware, software, or in combinations thereof. Embodiments of the present disclosure can be implemented in a computer program product tangibly embodied in a computer-readable storage device for execution by a programmable processor. The described processes can be performed by a programmable processor executing a program of instructions to perform functions by operating on input data and generating output. Embodiments of the present disclosure can be implemented in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, processors receive instructions and data from a read-only memory and/or a random access memory. Generally, a computer includes one or more mass storage devices for storing data files. Such devices include magnetic disks, such as internal hard disks and removable disks, magneto-optical disks; optical disks, and solid-state disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magnetooptical disks; and CD-ROM disks. Any of the foregoing can be supplemented by, or incorporated in, ASICs (application-specific integrated circuits).

A number of implementations have been described. Nevertheless, various modifications may be made without departing from the scope of the disclosure. Accordingly, other implementations are within the scope of the following claims.

What is claimed is:

1. An integrated circuit comprising:
   a first decoder configured to
     perform a first number of decoding iterations,
     generate first data in response to performing each of the first number of decoding iterations, and
     generate second data after performing all of the first number of decoding iterations;
   a second decoder configured to
     perform a second number of decoding iterations, wherein each of the second number of decoding iterations is performed in response to the first decoder performing all of the first number of decoding iterations, and
     generate soft information based on one or more of (i) input samples and (ii) the second data generated by the first decoder,
     wherein the first decoder is configured to generate the first data based on one or more of (i) the soft information generated by the second decoder and (ii) the first data from one of the first number of decoding iterations;
   a sensor configured to sense a temperature of the integrated circuit; and
   a controller configured to, based on the temperature of the integrated circuit sensed by the sensor, control at least one of the first number of decoding iterations or the second number of decoding iterations.

2. The integrated circuit of claim 1, wherein the controller is configured to:
   set a limit on the first number of decoding iterations or the second number of decoding iterations to less than or equal to a first predetermined number in response to the temperature of the integrated circuit being less than or equal to a first predetermined temperature;
   set the limit to less than or equal to a second predetermined number in response to the temperature of the integrated circuit being greater than the first predetermined temperature, wherein the second predetermined number is less than the first predetermined number; and
   set the limit to the first predetermined number in response to the temperature of the integrated circuit being less than or equal to a second predetermined temperature, wherein the second predetermined temperature is less than the first predetermined temperature.

3. The integrated circuit of claim 1, wherein the first decoder and the second decoder are configured to:
   generate codewords based on the input samples; and
   generate hard decisions for each of the codewords.

4. The integrated circuit of claim 3, further comprising:
   a syndrome calculator configured to calculate a syndrome of the hard decisions generated during one of the decoding iterations for each of the codewords,
   wherein the first decoder and the second decoder are configured to (i) output each of the codewords in response to the syndrome being all zeros, and (ii) continue the decoding iterations in response to the syndrome being not all zeros.

5. The integrated circuit of claim 1, wherein:
   the first decoder includes (i) a soft-output Viterbi algorithm (SOVA) decoder, (ii) a Bahl-Cocke-Jelinek-Raviv (BCJR) decoders, or (iii) a max a posteriori (MAP) decoder; and
   the second decoder includes (i) a low-density parity-check code (LDPC) decoder, (ii) a turbo code decoder, or (iii) an accumulate-repeat code decoder.

6. A method comprising:
   using a first decoder, (i) performing a first number of decoding iterations, (ii) generating first data in response to performing each of the first number of decoding iterations, and (iii) generating second data after performing all of the first number of decoding iterations;
   using a second decoder, (i) performing a second number of decoding iterations, wherein each of the second number of decoding iterations is performed in response to the first decoder performing all of the first number of decoding iterations, and (ii) generating soft information based on one or more of input samples and the second data generated by the first decoder,
   using the first decoder, generating the first data based on one or more of (i) the soft information generated by the second decoder and (ii) the first data from one of the first number of decoding iterations;
   sensing a temperature of an integrated circuit comprising the first decoder and the second decoder; and
   controlling, based on the temperature of the integrated circuit, at least one of the first number of decoding iterations or the second number of decoding iterations.

7. The method of claim 6, further comprising:
   setting a limit on the first number of decoding iterations or the second number of decoding iterations to less than or equal to a first predetermined number in response to the temperature of the integrated circuit being less than or equal to a first predetermined temperature;
   setting the limit to less than or equal to a second predetermined number in response to the temperature of the integrated circuit being greater than the first predetermined temperature, wherein the second predetermined number is less than the first predetermined number; and setting the limit to the first predetermined number in response to the temperature of the integrated circuit being less than or equal to a second predetermined temperature, wherein the second predetermined temperature is less than the first predetermined temperature.

8. The method of claim 6, further comprising, using the first decoder and the second decoder:
generating codewords based on the input samples; and
generating hard decisions for each of the codewords.

9. The method of claim 8, further comprising:
calculating a syndrome of the hard decisions generated during one of the decoding iterations for each of the codewords; and
using the first decoder and the second decoder, (i) outputting each of the codewords in response to the syndrome being all zeros, and (ii) continuing the decoding iterations in response to the syndrome being not all zeros.

10. The method of claim 6, wherein:
the first decoder includes (i) a soft-output Viterbi algorithm (SOVA) decoder, (ii) a Bahl-Cocke-Jelinek-Raviv (BCJR) decoders, or (iii) a max a posteriori (MAP) decoder; and
the second decoder includes (i) a low-density parity-check code (LDPC) decoder, (ii) a turbo code decoder, or (iii) an accumulate-repeat code decoder.

11. A storage device comprising:
a read circuit configured to
read data stored on a storage medium, and
generate input samples based on the data read from the storage medium;
a first decoder configured to
perform a first number of decoding iterations,
generate first data in response to performing each of the first number of decoding iterations, and
generate second data after performing all of the first number of decoding iterations;
a second decoder configured to
perform a second number of decoding iterations, wherein each of the second number of decoding iterations is performed in response to the first decoder performing all of the first number of decoding iterations, and
generate soft information based on one or more of (i) the input samples and (ii) the second data generated by the first decoder,
wherein the first decoder is configured to generate the first data based on one or more of (i) the soft information generated by the second decoder and (ii) the first data from one of the first number of decoding iterations, and wherein the first decoder and the second decoder are arranged in an integrated circuit;
a sensor configured to sense a temperature of the integrated circuit; and
a controller configured to control, based on the temperature of the integrated circuit sensed by the sensor, at least one of the first number of decoding iterations or the second number of decoding iterations.

12. The storage device of claim 11, wherein the controller is configured to:
set a limit on the first number of decoding iterations or the second number of decoding iterations to less than or equal to a first predetermined number in response to the temperature of the integrated circuit being less than or equal to a first predetermined temperature;
set the limit to less than or equal to a second predetermined number in response to the temperature of the integrated circuit being greater than the first predetermined temperature, wherein the second predetermined number is less than the first predetermined number; and
set the limit to the first predetermined number in response to the temperature of the integrated circuit being less than or equal to a second predetermined temperature, wherein the second predetermined temperature is less than the first predetermined temperature.

13. The storage device of claim 11, wherein the first decoder and the second decoder are configured to:
generate codewords based on the input samples; and
generate hard decisions for each of the codewords.

14. The storage device of claim 13, further comprising:
a syndrome calculator configured to calculate a syndrome of the hard decisions generated during one of the decoding iterations for each of the codewords,
wherein the first decoder and the second decoder are configured to (i) output each of the codewords in response to the syndrome being all zeros, and (ii) continue the decoding iterations in response to the syndrome being not all zeros.

15. The storage device of claim 11, wherein:
the first decoder includes (i) a soft-output Viterbi algorithm (SOVA) decoder, (ii) a Bahl-Cocke-Jelinek-Raviv (BCJR) decoders, or (iii) a max a posteriori (MAP) decoder; and
the second decoder includes (i) a low-density parity-check code (LDPC) decoder, (ii) a turbo code decoder, or (iii) an accumulate-repeat code decoder.

* * * * *